United States Patent [19]

Drauglis et al.

[11] 4,374,717

[45] Feb. 22, 1983

[54] PLASMA POLYMERIZED INTERFACIAL COATINGS FOR IMPROVED ADHESION OF SPUTTERED BRIGHT METAL ON PLASTIC

[75] Inventors: Edmund Drauglis, Columbus; Roy F. Wielonski, Worthington; Francis A. Sliemers, Columbus, all of Ohio

[73] Assignee: General Motors Corporation, Detroit, Mich.

[21] Appl. No.: 318,634

[22] Filed: Nov. 5, 1981

[51] Int. Cl.³ .................. C23C 15/00; B32B 15/08; B05D 1/36

[52] U.S. Cl. .................. 204/192 C; 427/40; 427/41

[58] Field of Search ............... 427/40, 41; 204/192 C

[56] References Cited

U.S. PATENT DOCUMENTS 3,986,944 10/1976 Gould .................. 204/192 C

Primary Examiner—James R. Hoffman
Attorney, Agent, or Firm—Elizabeth F. Harasek

[57] ABSTRACT

The adhesion of sputtered chromium or chromium metal alloys to urethane substrates is improved by the application of plasma polymerized acetonitrile coating layers directly beneath and over the chromium layer.

2 Claims, No Drawings

PLASMA POLYMERIZED INTERFACIAL COATINGS FOR IMPROVED ADHESION OF SPUTTERED BRIGHT METAL ON PLASTIC

This invention relates to a method of improving adhesion between a thermoplastic polymeric substrate and a sputtered chromium containing coating. The invention more specifically relates to the improvement in adhesion brought about by the deposition of acetonitrile polymer layers directly underneath and over such a sputtered chromium coating, the polymer layers being formed by means of a radio frequency generated plasma containing chemically activated acetonitrile (monomer).

BACKGROUND

One means of providing a bright metal finish on a molded plastic item is to sputter a thin layer of chromium or chromium-containing alloy onto its surface. Herein, the term chromium or chrome layer refers to a thin layer of chromium or chromium-containing metal applied to a substrate by vacuum sputtering methods. A sputtered layer only a few microns thick can provide an appearance equivalent to that of a like article with a substantially thicker electroplated chromium coating. Generally, a clear, glossy topcoat is applied over a sputtered chromium layer to prevent wear by abrasion and exposure to corrosive environmental conditions.

Sputtered metal coatings may not adhere strongly enough to a plastic substrate to endure the type of adverse environmental conditions encountered by exterior and interior automotive trim parts. Because the coefficients of thermal expansion of plastic and sputtered metal layers are very different, thermal cycling may lead to delamination of a coating. Flexing a pliable or elastomeric substrate may cause a sputtered layer to crack and peel. The initial adhesion of a sputtered chromium-containing coating may also be adversely affected by such conditions as inadequate cleaning of the substrate, the presence of mold release agents, the presence of solvent in the plastic substrate or base coat, incompatability of the plastic and metal, or other conditions brought about by the composition of the constituents or processing conditions.

Thus, means have been sought to consistently provide for good adhesion between sputtered metal and plastic substrates. We have developed a method of improving adhesion which mitigates such adhesion-inhibiting conditions without addition of costly equipment or time consuming steps.

OBJECTS

Accordingly it is an object of the invention to provide means for improving adhesion between sputtered chromium or chromium alloy coatings and polymeric substrates. A more particular object is to expose a thermoplastic substrate, with or without a preapplied basecoat, to a plasma containing acetonitrile(monomer) to generate a plasma polymerized coating directly underneath and over a sputtered layer of chromium containing metal to improve its adhesion. A more specific object is to improve the adhesion of a sputtered bright chromium layer to an elastomeric thermoplastic workpiece by the application of such plasma polymerized coatings. Another specific object is to provide a specially adapted sputtering method for sequentially applying a plasma polymerized acetonitrile base layer to a thermoplastic urethane substrate; a chromium containing bright metal layer; a second layer of plasma polymerized acetonitrile; and a protective clear polymeric topcoat such that the plasma polymerized layers improve adhesion between all the coating layers and the substrate. Another particular object is to provide a method of improving the adhesion of such coatings in a vacuum-sputtering apparatus in conjunction with a chromium metal sputtering process without breaking the vacuum.

BRIEF SUMMARY

In accordance with a preferred practice of our invention, a molded article of thermoplastic urethane (TPU) is provided with successive coats of plasma polymerized acetonitrile, chromium metal, and plasma polymerized acetonitrile in successive treatment chambers in a vacuum sputtering device. Each chamber is provided with a cathode and a radio frequency power supply to induce a gas plasma.

In the acetonitrile(monomer)coating steps, the chamber is initially pumped down to a vacuum below about $1 \times 10^{-5}$ torr (1 torr=1 mm$_{Hg}$=1000 microns $_{Hg}$=1/760 atmosphere). An inert gas, preferably argon, and acetonitrile(monomer) are then leaked into the chamber. A constant pressure is maintained throughout the acetonitrile plasma coating step by admitting additional monomer and inert gas into the chamber at a rate to replace that lost by plasma desposition and vacuum pumping. Suitable radio frequency power is applied to initiate and maintain polymerization of the acetonitrile at a desired rate. The plasma polymerization process step is continued for a short time, generally less than three minutes.

In the process, a first layer of plasma polymerized acetonitrile is applied to a clean, dry TPU article. The article is then moved into a second vacuum chamber where a thin layer of chromium or chromium alloy is sputtered onto the article. Another layer of plasma polymerized acetonitrile is applied over the chromium layer in the next vacuum chamber as set forth above. The article is then preferably topcoated with a layer of clear, glossy, curable polyurethane to protect the chromium layer from abrasion or corrosive environmental conditions.

The plasma polymerized layers of acetonitrile serve to improve the adhesion between the chromium layer and the base thermoplastic as well as between the chromium layer and the topcoat. Without the benefit of the plasma polymerized acetonitrile coatings, the chromium layer may be prone to delamination upon extended exposure to such conditions as high humidity and thermal cycling. Pretreating the substrate with acetonitrile under vacuum conditions seems to reduce adhesion problems caused by e.g., minute surface contamination with mold release, dirt, or unevaporated base coat solvent.

DETAILED DESCRIPTION

Our invention will be better understood in view of the following detailed description and specific examples.

The invention relates to a method of improving adhesion between sputtered chromium coatings and a thermoplastic substrate, particularly, injection or compression molded thermoplastic urethane. Two such thermoplastic urethanes are Estane 38130 and Estane 58133, both made by B. F. Goodrich. They are linear reaction products of p,p'-diphenyl methane diisocyanate, poly(tetramethylene adipate) and 1,4-butane diol. They are injection moldable and have glass transition temperatures in the range of $-31°$ to $-36°$ C.

A base coat for a molded thermoplastic article may be desirable, e.g., to compensate for minute surface defects or create a high gloss underlayer for a sputtered chromium layer. If a base coat resin is carried in a solvent for application, it is important that residual volatiles be completely removed before plasma coating. Otherwise, the escape of volatiles from the workpiece might interfere with the adherence of both the plasma polymerized and sputtered chromium layers.

This invention relates particularly to plastic parts with bright metal sputtered coatings. The metal is preferably pure chromium metal or an alloy of chromium and other metal such as iron, nickel, aluminum, silver, etc. Herein the term chromium, chrome, or bright metal sputtered coating may refer to any such combination of metals. Generally, the metal is provided in the form of a sputtering target. The target is positioned in a vacuum chamber so that ions contained in a plasma of inert gas, accelerated toward the target by electrical attraction, impact the target and dislodge the target atoms in a manner such that they are redeposited on a plastic substrate.

Plasma polymerization of acetonitrile(monomer) is at the heart of this invention. Plasma polymerization is a unique process for making thin, adherent, pin-hole free organic coatings. The process occurs by the reaction of active monomer species on a substrate in a moderate vacuum of about 0.1 torr or less. Acetonitrile ($H_3CCN$, also called methyl cyanide) is not conventionally polymerizable. It does not contain the unsaturation necessary for addition polymerization nor the functional chemical groups of condensation polymerization precursors. However, when acetonitrile(monomer) is delivered to a vacuum chamber in gaseous form along with an inert gas carrier, radio frequency radiation activates the monomer in such manner as to form chemically active species we believe to consist of acetonitrile ions. Although the reaction mechanism of the polymerization of activated acetonitrile on a polymer substrate is not exactly known, our evidence suggests that a highly chain branched acetonitrile polymer with no long sequences of linear groups is formed. The nitrile coating microstructure is amorphous, densely packed and provides excellent solvent resistance as well as improved chromium adhesion.

The creation of the acetonitrile plasma and the inert gas plasma for chrome sputtering may be by capacitative or inductive modes. In a capacitative mode, two electrodes face each other and a glow is created in the space between them. Generally, the substrate is attached to one of the electrodes. In an inductive system, a radio frequency activated coil surrounds the vacuum chamber. The glow fills the chamber and coats everything within it. The capacitative mode is generally preferred because it confines the plasma to a more specific location which makes clean-up and substrate cooling (where required) easier to accomplish.

Four operating paramaters for the plasma generating equipment are power level, substrate temperature, chamber pressure, and inlet gas flow rate. Deposition rates of acetonitrile polymer are directly proportional to power level and operating pressure. At high power levels and pressures of acetonitrile monomer, polymer may form in the vapor phase, adhere poorly to the substrate, degrade into a weak material, and become undesirably colored. Low substrate temperatures increase the deposition rate and improve the acetonitrile film clarity. Increasing monomer flow rates improves the stability and quality of plasma polymerized acetonitrile films, however, too high a flow rate inhibits film formation. For the polymerization of acetonitrile(monomer), we prefer to operate radio frequency plasma generating apparatus at a power level of 25 Watts. Current and voltage may be adjusted as necessary to achieve optimum coating conditions. The pressure within the plasma chamber should be less than 0.1 torr. The monomer and inert gas flow rates are generally adjusted to maintain the chamber pressure at such desired level. We have found a partial pressure of about $25\mu$ inert gas and $25\mu$ acetonitrile to be suitable. (A Vacuum of $1 \times 10^{-5}$ torr $= 10^{-2}\mu$ Hg; $25 \times 10^{-3}$ torr $= 25\mu$ Hg; and $50 \times 10^{-3}$ torr $= 50\mu$ Hg.) We have not found it generally necessary to cool the workpiece to encourage polymer deposition or prevent its overheating. It is within the skill of the art to balance the variables of power level, substrate temperature, chamber pressure and monomer flow rate to optimize the practice of the invention.

A preferred apparatus for the practice of our invention is a closed system capable of maintaining a high vacuum having three interconnected chambers, each equipped with plasma generating means. The chambers would be isolated from one another primarily so that acetonitrile from the plasma polymerizing stages would not contaminate the chromium sputtering target or chamber. The chambers could be separated by doors or baffles, and the workpieces carried on automatic conveyors. The first stage would be for the application of a plasma polymerized acetonitrile coating, the second for the application of a sputtered chromium coating, and the third for the application of an overlayer of plasma polymerized acetonitrile. Each chamber would be pumped down after the coating step was completed and before conveying the workpiece to the next vacuum chamber.

In the Examples set forth hereafter, all coating steps were conducted in a single experimental 18" diameter cylindrical vacuum chamber. An S-gun capacitative type plasma generator (made by Varian, Inc.) was installed in the top cover. A substantially pure chromium metal target was inserted into the S-gun. The vacuum chamber was evacuated by a 6" diffusion pump with appropriate fore pump. Power levels of from 400 to 3000 Watts were tried to optimize chromium sputtering. A power of 440 Watts (440 volts at 1 ampere) was finally selected as the optimum level for sputtering the chromium target and was used for the examples described herein. At higher power levels, chamber outgassing had a deleterious effect on the quality of deposited chromium. The rate of chromium deposition was in the range of 1000 to 1500 Angstroms per minute for a cathode to substrate distance of about 16.5 centimeters.

EXAMPLE I

A number of molded samples of thermoplastic urethane were treated as shown in Table I. The urethane plaques were made of Estane 58130 sold by B. F. Goodrich. They were cleaned and dried before sputtering. Two plaques of thermoplastic urethane approximately 2-inch wide by 4-inch long were placed side by side on a 4-inch square cathode. The cathode was positioned directly beneath the chromium target at a distance of about 16.5 cm. The system was pumped down to a pressure of $1\times10^{-5}$ torr or less and argon was introduced through a needle valve to a pressure of about $2.5\times10^{-4}$ torr. Acetonitrile(monomer) was then admitted to the chamber to bring the total pressure to $5.0\times10^{-4}$ torr. Both argon pressure and monomer pressure were measured by means of an MKS Baratron capacitative manometer. 25 watts of radio frequency power from a 50 ohm generator were then applied to the cathode to generate a glow discharge and initiate polymerization of acetonitrile on the urethane substrate. After polymerization had proceeded for the desired time, the power was turned off and the flow of argon and acetonitrile monomer was stopped. The chamber was then pumped down to a pressure of $1\times10^{-5}$ torr or less. The chromium target was sputtered for 30 seconds in an atmosphere of $1\times10^{-3}$ torr argon. After the sputtering, the chamber was again pumped down and the argon and monomer valves opened. Another layer of plasma polymerized acetonitrile and deposited on top of the sputtered metal in the manner described above. After vacuum processing was completed, the specimens were spray coated with a heat-curable, two-part, polyurethane top coating made by Celanese and dried at 65° C. for one hour. The top coat was made by mixing Celanese #7609 containing polyol, catalyst, modifiers and flexibilizers and Celanese #7608 containing a cross-linking agent, hexamethylene diisocyanate and biuret. It is important to the practice of the invention that the top coat does not attack the substrate or basecoat.

TABLE I

ACETONITRILE PLASMA COATING OF UNBASECOATED TPU

SUBSTRATE: BFG 58130 TPU, No Basecoat
PLASMA TREATMENT: Argon Pressure 25µ
Acetonitrile Pressure 25µ
Power Level 25 watts
TOPCOAT: Celanese 7608-7609

| Specimen | Exposure (min) | | Tape Test Results | | | | | |
|---|---|---|---|---|---|---|---|---|
| | | | Dry | | 2 hour Soak | | 96 hour Humidity | |
| | $IF_1$ | $IF_2$ | Cr | TC | Cr | TC | Cr | TC |
| 1 | 0 | 0 | P | P | P | P | — | F |
| 2 | 0 | 0 | P | P | P | P | P | F |
| 3 | 0 | 0 | P | P | P | P | P | P |
| 4-9 | 0 | 0 | F | F | F | F | F | F |
| 10 | 0 | 0.5 | P | P | P | F | P | F |
| 11 | 0.5 | 0 | P | P | P | P | P | F |
| 12 | 0.5 | 0.5 | P | P | P | P | P | P |
| 13 | 0.5 | 0.5 | P | P | P | P | P | P |
| 14 | 0 | 1.0 | P | P | P | F | P | F |
| 15 | 1.0 | 0 | P | P | P | P | P | F |
| 16 | 1.0 | 0 | P | P | P | P | P | F |
| 17 | 1.0 | 0 | P | P | P | P | F | — |
| 18 | 1.0 | 0 | P | P | P | P | P | P |
| 19 | 1.0 | 0 | P | P | P | P | P | F |
| 20 | 1.0 | 0 | P | P | P | P | P | P |
| 21 | 1.0 | 0 | P | P | P | P | P | P |
| 22 | 1.0 | 1.0 | P | P | P | P | — | F |
| 23 | 1.0 | 1.0 | P | P | P | P | P | P |
| 24 | 1.0 | 1.0 | P | P | P | P | P | F |
| 25 | 1.0 | 1.0 | P | P | P | P | F | — |
| 26 | 1.0 | 1.0 | P | P | P | P | P | P |
| 27 | 2.0 | 0.5 | P | P | P | P | P | P |
| 28 | 2.0 | 0.5 | P | P | P | P | P | P |
| 29 | 3.0 | 0.5 | P | P | P | P | P | P |

After a minimum of 72 hours following top-coating, the specimens were evaluated for chromium layer and topcoat adhesion by means of a standard tape test. Cross hatches were cut in the samples with a utility knife and 3M tape No. 710 was applied, rubbed down, and then pulled off. Loss of topcoating or metal layers in the cross hatch area signified test failure.

Those specimens passing the dry tape test were then immersed in distilled water at a temperature of 38° C. for 2 hours. At the end of that time they were air dried for 10 minutes and subjected again to the standard tape test. The specimens passing this test were further exposed in a humidity cabinet at a temperature of 38° C. and relative humidity of 100% for at least 96 hours. Following this humidity cabinet exposure, the samples were removed, dried, and again subjected to the tape test.

In the first Example, thermoplastic urethane without basecoat was exposed to plasma polymerized acetonitrile coating as set forth in Table I. Several variations in plasma exposure time were used. In the Tables, "$IF_1$" refers to interfacial acetonitrile coatings applied underneath the sputtered chromium layer and "$IF_2$" to interfacial acetonitrile layers applied over the chromium layer. Some samples were provided with no acetonitrile coating, others only with an undercoating and others with only an overcoating. Several of the samples were provided with acetonitrile polymer coatings both above and below the chromium layer. Under the columns headed Tape Test Results, "Cr" refers to the success or failure of the sputtered chromium layer and "TC" refers to the success or failure of the topcoat layer. In the tables, P and F refer to the results obtained from the adhesion tape test and indicate that the coating passed (P) or failed (F) the test. "—" indicates no test conducted. An extremely high rate of failure, particularly on the 96 hour humidity exposure, was experienced by samples provided with no plasma polymerized acetonitrile coating, only a plasma polymerized undercoat, or only a plasma polymerized overcoat. Significantly improved adhesion was provided only when the thermoplastic urethane substrate was first exposed to the acetonitrile plasma, thereafter sputtered with the chromium target, exposed to a second acetonitrile plasma and topcoated.

EXAMPLE II

A number of thermoplastic urethane slabs were molded from Estane 58130 and precoated with PPG VMB-1 basecoat. The basecoat is a clear, flexible, thermoplastic urethane resin dissolved in methyl ethyl ketone and ethylene acetate. The basecoated slabs were treated with a first acetonitrile plasma by the method set forth in Example I as recorded in Table II. They were sputtered with a chromium layer and subjected to a plasma polymerized overcoating as indicated in the Table. They were topcoated with PPG VMT-14 and subjected to tape testing as in Example I.

Again, it is clear from the results of the tape tests that the application of both an underlayer and an overlayer of plasma polymerized acetonitrile adjacent the sputtered chrome provides the best results. Heating the base coated specimens for 17 hours at 150° F. improved the performance of the nitrile coatings. A number of failures were believed to have been caused by inadequate drying of the base coat before vacuum treatment.

TABLE II

ACETONITRILE PLASMA COATING OF TPU WITH PPG VMB-1 BASECOAT

| | |
|---|---|
| SUBSTRATE: | BFG 58130 TPU with PPG VMB-1 Basecoat |
| PLASMA TREATMENT: | Argon Pressure 25μ |
| | Acetonitrile Pressure 25μ |
| | Power Level 25 watts |
| TOPCOAT: | PPG VMT-14 |

Tape Test Results

| Specimen | Exposure (min) IF$_1$ | Exposure (min) IF$_2$ | Dry Cr | Dry TC | 2 hour Soak Cr | 2 hour Soak TC | Humidity 96 (Hr) Cr | Humidity 96 (Hr) TC | Humidity 264 (Hr) Cr | Humidity 264 (Hr) TC |
|---|---|---|---|---|---|---|---|---|---|---|
| 1 | 0 | 0 | P | P | P | P | F | — | F | — |
| 2 | 0 | 0 | P | P | P | P | F | — | — | — |
| 3 | 0 | 0 | P | P | P | P | F | — | — | — |
| 4 | 0 | 0 | P | P | F | F | F | — | F | — |
| 5-11 | 0 | 0 | P | P | F | — | — | — | — | — |
| 12 | 0 | 0 | P | P | F | F | F | — | F | — |
| 13 | 0 | 0 | P | P | F | F | F | — | F | — |
| 14 | 0 | 0 | P | P | P | P | P | P | P | F |
| 15 | 0 | 0 | P | P | P | P | P | P | P | F |
| 16 | 0 | 0 | P | P | P | P | P | P | P | P |
| 17 | 0 | 0.5 | P | P | P | P | F | — | F | — |
| 18 | 0.5 | 0 | P | P | P | P | F | — | F | — |
| 19 | 0.5 | 0.5 | P | P | P | P | F | — | F | — |
| 20 | 0 | 1.0 | P | P | P | P | P | — | P | — |
| 21 | 0 | 1.0 | P | P | P | P | P | P | P | P |
| 22 | 0 | 1.0 | P | P | P | P | P | P | P | P |
| 23 | 1.0 | 0 | P | P | P | P | P | P | P | F |
| 24 | 1.0 | 0 | P | P | P | P | P | — | F | — |
| 25 | 1.0 | 0 | P | P | P | P | F | — | — | — |
| 26 | 1.0 | 0 | P | P | F | P | F | — | — | — |
| 27 | 1.0 | 0 | P | P | P | P | P | — | P | — |
| 28 | 0.5 | 1.0 | P | P | P | P | P | P | P | P |
| 29 | 1.0 | 1.0 | P | P | P | P | P | P | P | F |
| 30 | 1.0 | 1.0 | P | P | P | P | P | P | P | P |
| 31 | 1.0 | 1.0 | P | P | P | P | F | — | — | — |
| 32 | 1.0 | 1.0 | P | P | P | P | F | — | — | — |
| 33 | 1.0 | 1.0 | P | P | P | P | — | — | P | — |
| 34 | 1.0 | 1.0 | P | P | P | P | F | — | — | — |
| 35 | 1.0 | 1.0 | P | P | P | P | F | — | — | — |
| 36 | 2.0 | 0.5 | P | P | F | F | — | — | — | — |
| 37 | 0 | 3.0 | P | P | F | F | F | — | F | — |
| 38 | 0 | 3.0 | P | P | F | F | F | — | F | — |
| 39 | 1.0 | 3.0 | P | P | P | P | F | — | F | — |
| 40 | 1.0 | 3.0 | P | P | P | P | P | — | P | — |
| 41 | 3.0 | 1.0 | P | P | P | P | F | — | P | — |
| 42 | 3.0 | 1.0 | P | P | P | P | F | — | F | — |
| 43 | 3.0 | 3.0 | P | P | F | — | — | — | — | — |
| 44 | 3.0 | 3.0 | P | P | F | — | — | — | — | — |
| 45 | 5.0 | 0 | P | P | P | P | F | — | F | — |
| 46 | 5.0 | 5.0 | P | P | P | P | P | — | P | — |

While our invention has been described in terms of specific embodiments thereof, other forms may be readily adapted by one skilled in the art. Therefore, our invention is to be limited only by the following claims.

The embodiments of the invention in which an exclusive property or privilege is claimed are defined as follows:

1. A method of improving adhesion between layers of a thermoplastic urethane article sputtered with a bright metal coating comprised of chromium metal and having a clear protective urethane overcoating comprising:
    providing a clean sputtering surface on a said thermoplastic urethane article;
    exposing said surface to a radio frequency induced plasma of acetonitrile monomer such that a coherent thin coating layer of polymerized acetonitrile is formed thereon;
    sputtering said article with a bright metal coating layer containing chromium metal;
    exposing said metal coating layer to a second radio frequency induced plasma of acetonitrile to form a second coherent thin coating layer of polymerized acetonitrile thereon; and
    covering said second polymerized acetonitrile layer with a clear compatible, protective layer comprised of polymeric urethane.

2. A method of improving the adhesion of sputtered chromium or chromium metal alloy to a flexible, thermoplastic urethane substrate comprising the steps of
    exposing said urethane substrate to a radio frequency induced plasma of acetonitrile monomer in an inert gas atmosphere thereby polymerizing said monomer on the substrate surface and forming a receptive underlayer for said metal;
    sputtering the acetonitrile plasma exposed substrate with a coating of said chromium or chromium alloy; and
    thereafter exposing said chromium sputtered substrate to a second radio frequency induced plasma of acetonitrile monomer to form a polymerized protective overlayer therefor, whereby said method the plasma polymerized acetonitrile underlayer and overlayer provide improved adhesion of the sputtered chromium to the urethane substrate as measured by a tape adhesion test.

* * * * *